(12) United States Patent
Tsunesada

(10) Patent No.: US 6,421,277 B2
(45) Date of Patent: Jul. 16, 2002

(54) NON-VOLATILE SEMICONDUCTOR MEMORY DEVICE

(75) Inventor: Nobutoshi Tsunesada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/745,787

(22) Filed: Dec. 21, 2000

(30) Foreign Application Priority Data

Dec. 24, 1999 (JP) .......................................... 11-368429

(51) Int. Cl.$^7$ ................................................ G11C 11/34
(52) U.S. Cl. ................................. 365/185.3; 365/185.24
(58) Field of Search ....................... 365/185.22, 185.24, 365/185.3

(56) References Cited

U.S. PATENT DOCUMENTS 6,219,280 B1 * 4/2001 Naganawa ............. 365/185.22

FOREIGN PATENT DOCUMENTS

JP  8-106793  4/1996

* cited by examiner

Primary Examiner—M. Tran
(74) Attorney, Agent, or Firm—Hutchins, Wheeler & Dittmar

(57) ABSTRACT

A threshold voltage distribution D2 apparently decreases to a distribution D3 when there is a distribution D1 of memory cells having deep depletion. After an erase is performed utilizing an erase determination level 1 higher than a desired erase determination level 2, only data in memory cells of distribution D1 is rewritten utilizing a rewrite determination level 1 lower than a desired rewrite determination level 2. The erase is performed utilizing erase determination level 2 since the threshold voltage distribution shifts a distribution D7 by canceling the effect caused by the memory cells having deep depletion, and only data in the memory cells having shallow depletion is rewritten.

11 Claims, 9 Drawing Sheets

NON-VOLATILE SEMICONDUCTOR MEMORY DEVICE

BACKGROUND OF THE INVENTION

1. Field of the Invention

The present invention relates to a non-volatile semiconductor memory device which erases data of memory cells all at once, and particularly, for an NOR type flash memory, a non-volatile semiconductor memory device in which data of the memory cells is over-erased so as to give rise to problems.

2. Description of Related Art Including Information Disclosed Under 37 CFR 1.97 and 37 CFR 1.98

Recently, a flash memory is mainly used as a non-volatile semiconductor memory device in which data can be electrically written into and erased from the memory cell. The flash memory can erase data of the memory cells all at once for each block (which is also called a "sector") composed of memory cells of all or a part of a memory cell array.

In a flash memory, electrons are injected into a floating gate of the memory cell in order to write into the memory cell or are extracted from the floating gate of the memory cell in order to erase from the memory cell. Since a threshold voltage of the memory cell is varied depending on the amount of electric charge accumulated in the floating gate, using this property, when electrons are injected into the floating gate and the threshold voltage reaches a high level (writing state) for example, this condition corresponds to a logic value of "0". On the other hand, when electrons are extracted from the floating gate and the threshold voltage reaches a low level (erasing state) for example, this condition corresponds to a logic value of "1".

However, the erasing speed depends on each memory cell because of the variation in the quality such as the thickness of the oxide film of the transistors composing the memory cells, or minor defects. Even if the data of the memory cells is erased using the same method, the threshold voltages of every memory cell are not uniform and the threshold voltage has a predetermined distribution in view of the memory cells as a whole. If batch erasing is performed until reaching the threshold voltage for the memory cells having a slow erasing speed, the batch erasing will be excessively performed for the memory cells having a fast erasing speed. A memory cell in which data is over-erased is called "a memory cell having deep depletion" or "a memory cell having a depletion defect". Such memory cells in which data is over-erased generate various problems; therefore, it is required that the presence of these memory cells be completely eliminated.

A flash memory utilizing a countermeasure for memory cells having deep depletion is disclosed in, for example, Japanese Unexamined Patent Application No. Hei 8-106793 (hereinafter, referred to as JP 8-106793). In this application, erasing the data of the memory cell in an erasure block is performed as follows. A memory cell having a low threshold voltage, logic value "1", is detected and is written until reaching a high threshold voltage, logic value "0", so that every memory cell in the erasure block has a high threshold voltage, logic value "0". Next, the data of all memory cells in the erasure block is erased all at once so that each memory cell has a logic value "1". The data of the memory cells is erased so that the upper limit of the threshold voltage of each memory cell is the predetermined "erase verify voltage".

As described above, when the batch erasing is performed, memory cells having deep depletion are generated in which the threshold voltage is negative due to the variations in the erasing speeds of each memory cell. The voltage of a word line applied to a control gate of the memory cell is set to "0 V", and memory cells having deep depletion are detected and rewritten so as not to be in depletion. Because it is not known which memory cells connected to a digit line (which is also referred to a bit line, a data line, or the like) have deep depletion, the rewrite is performed for each digit line and not for each memory cell.

Therefore, shallow writing is performed in every memory cell connected to the digit line, verifying is performed to detect whether depletion is not in the digit line, and shallow rewriting is repeated until the data of memory cells in the digit line having deep depletion is completely erased. The voltage of the word line is set to "1.2 V" and rewriting and verifying are performed for each memory cell, in the same way that "0 V" is applied to the word line, in order to rewrite memory cells having latent deep depletion.

However, in the flash memory disclosed in the above-mentioned document JP 8-106793, the following problems arises.

FIG. 8 shows graphs explaining this problem, and shows the threshold voltage distribution for memory cells as a whole in the erasure block. The X-axes show the number of memory cells N for each threshold voltage, and the Y-axes show the threshold voltages Vtm of the memory cells. The graph on the left in FIG. 8 shows the actual distributions of the threshold voltage. The distribution indicated by a reference letter D1 shows memory cells having deep depletion, and the distribution indicated by a reference letter D2 shows normally erased memory cells having no depletion.

Furthermore, the graph in the center of FIG. 8 shows the apparent distributions of the threshold voltage. The distribution of normally erased memory cells indicated by a reference letter D3 seems to be at lower position than distribution D2 shown in the graph on the left. This is caused by the existence of memory cells having deep depletion shown in distribution D1. The will be explained as follows. FIG. 9 is a partial diagrammatic view of a flash memory. A digit line 100 is one of the digit lines composing the memory cell array. A sense amplifier 101 senses a memory data of the memory cell connected to digit line 100 by comparing an amount of electric current of a current Id passing through digit line 100 with an amount of electric current of a predetermined reference electric current.

Furthermore, each of the memory cells 102 to 104 is a part of the memory cells connected to the digit line 100. Word lines 105 to 107 are signal lines for selecting these memory cells 102 to 104. Electric currents Ic1 to Ic3 are currents passed between the drain sources of memory cells 102 to 104, respectively. Memory cells 102 and 103 are in a writing state and memory cell 104 is a memory cell having deep depletion. To determine the threshold voltage of memory cell 102, a predetermined voltage is applied to word line 105, and word lines 106 and 107 and other word lines (not shown) are set to "0V".

In contrast, if memory cell 104 is not a memory cell having deep depletion, as long as the above predetermined voltage applied to word line 105 does not reach the threshold voltage of memory cell 102, memory cell 102 will remain OFF and the amount of electric current Ic1 is approximately "0". Since electric current is not applied to word lines other than word line 105, the amounts of electric current Ic2 and Ic3 are approximately "0". Therefore, the amount of electric current Id becomes approximately "0". On the other hand, when the predetermined voltage applied to word line 105 is equal to or greater than the threshold voltage of memory cell 102, memory cell 102 turns ON. Subsequently, electric current Ic1, depending on the characteristics of memory cell 102, flows, and electric current Id equals electric current Ic1 since the amounts of electric currents Ic2 and Ic3 are "0". Therefore, sense amplifier 101 senses the amount of electric current Id to determine whether the threshold voltage of memory cell 102 is equal to or greater than the predetermined voltage.

However, if memory cell 104 is a memory cell having deep depletion, for example, when memory cell 102 is read, even if the actual data stored in each memory cell is "0", an error reading may occur as if the data stored in the memory cell was "1". Since the threshold voltage of memory cell 104 having deep depletion is less than "0 V", a considerable amount of electric current Ic3 flows even if the voltage to be applied to word line 107 is "0 V". Therefore, when memory cell 102 is chosen, the amount of electric current Id is the sum of electric currents Ic1 and Ic3.

Memory cells 102, 103, and the like which are connected to the digit lines and are identical to the memory cells in which data is over-erased, are read, such that the amount of electric current Id apparently increases. If the voltages applied to the control gates of the memory cells are the same, the amount of the electric current passing through each memory cell increases as the threshold voltage of the memory cell decreases. Therefore, an apparent increase in the amount of electric current Id is equivalent to an apparent decrease in the threshold voltage of memory cell 102. Similarly, this occurs in other memory cells; therefore, the threshold voltage distributions of all memory cells of the erasure block, as mentioned above, seem to be distributions which are as a whole at a lower position than the positions of the actual distributions.

If the additional amount of electric current Ic3 is large, the amount of electric current Id exceeds the amount of the reference electric current. Therefore, a problem arises wherein memory cell 102 actually has a data value of "0" which specifies a high threshold voltage but memory cell 102 apparently has a data value of "1" which specifies a low threshold voltage. To prevent such an error reading, the memory cell having deep depletion is rewritten to eliminate the over-erase condition and restore the normal erase condition. However, in conventional flash memory, further problems arises in the rewriting process as follows.

If the threshold voltage distribution is apparently at a low position due to memory cells having deep depletion, when memory cells having a threshold voltage whose level is equal to or greater than a "rewrite determination level" as shown in FIG. 8 are rewritten, memory cells of the distribution D3 having a threshold voltage whose level is less than the rewrite determination level are normally erased. Therefore, the rewrite is not required. However, in actuality, memory cells having a threshold voltage whose level is less than the rewrite determination level are rewritten. Since the rewrite for the memory cells cannot be performed simultaneously with the erasure, the rewrite is performed per each memory cell unit. Therefore, for rewriting of the memory cells in which rewriting is not actually required, the process time for the erasure process as a whole increases.

Furthermore, when the rewrite is performed for the distribution shown in the center of FIG. 8, threshold voltage distributions D1 and D3 of the memory cells become the distributions D4 and D5 shown on the right in FIG. 8. In the erasing operation, the threshold voltages of all the memory cells of the erasure blocks need to be equal to or less than an "erase determination level" (shown on the right in FIG. 8).

The threshold voltage of distribution D5 increases above the "erase determination level". In order to be equal to or less than the "erase determination level" for the memory cells of distribution D5, the erasure needs to be performed again. Therefore, the process time for the erasure process as a whole further increases. If memory cells having deep depletion are generated due to the erasure again, the rewrite is required again. Depending on the conditions, there is a possibility that the erasure and the rewrite may be repeated endlessly.

Moreover, if there are memory cells having deep depletion, the distribution of the threshold voltage is, as a whole, extended as shown in the distributions D4 and D5. Therefore, when the verify which detects whether the threshold voltage of the memory cell during the rewrite is equal to or greater than the "rewrite determination level" is performed, a problem arises wherein read margin may not sufficiently remain. Therefore, memory cells having deep depletion are removed beforehand, and the width of the threshold voltage distribution is reduced to leave sufficient read margins.

Additionally, in order to obtain transistors with pressure drop resistance, low electric power consumption, and high speed, due to miniaturization, are fined in recent years, various semiconductor devices comprising a non-volatile semiconductor memory have been changing to devices having a low power-supply voltage operation. The threshold voltage of the memory cells needs to be decreased and the threshold voltage distribution of the memory cells needs to be narrow at the same time in order to achieve low power-supply voltage operation. However, since the original threshold voltage distribution of the memory cells is determined according to the manufacturing process, it is not easy to make improvements by decreasing the threshold voltage in the manufacturing process. Therefore, it is describe that circuit operations, such as the erasing operation, be improved without modifying the manufacturing process in order to essentially narrow the threshold voltage distribution.

BRIEF SUMMARY OF THE INVENTION

In light of the above problems, the object of the present invention is to provide a non-volatile semiconductor memory in which unnecessary rewrites are not performed even when there are memory cells having deep depletion, and in which the process time for the erasure process as a whole is not increased by increasing the number of rewrites. Furthermore, another object of the present invention is to provide a non-volatile semiconductor memory in which a sufficient read margin is remains and the memory is suitable for low power-supply voltage operation by narrowing the width of the threshold voltage distribution of the memory cells as much as possible.

To solve the above-mentioned problems, a first aspect of the present invention is a non-volatile semiconductor memory comprising a non-volatile memory cell which is capable of being written to and totally erased electrically and in which a threshold voltage distribution of the memory cell is affected by memory cells in which data is over-erased, wherein the memory is provided with: a first erasing means for totally erasing erasable memory cells, a first rewriting means for rewriting memory cells in which data is over-erased by totally erasing while simultaneously verifying each memory cell, a second erasing means for erasing memory cells which were not erased up to a desired erase determination level after the first rewrite, and a second rewriting means for rewriting memory cells which were not rewritten up to a desired rewrite determination level while simultaneously verifying each memory cell after the second erase.

A second aspect of the present invention is a non-volatile semiconductor memory comprising a non-volatile memory cell which is capable of being written to and totally erased electrically and in which a threshold voltage distribution of the memory cell is affected by the memory cell in which data is over-erased, wherein the memory is provided with: a first erasing means for totally erasing erasable memory cells up to a first erase determination level which is higher than a desired erase determination level, a first rewriting means for rewriting memory cells in which data is over-erased by totally erasing up to a first rewrite determination level lower than a desired rewrite determination level while simultaneously verifying for each memory cell, a second erasing means for erasing memory cells which were not erased up to the desired erase determination level after the first rewrite, and a second rewriting means for rewriting memory cells which were not rewritten up to the desired rewrite determination level while simultaneously verifying each memory cell after the second erase.

According to the first and second aspects of the present invention, if the threshold voltage distribution seems to be in a lower position owing to the memory cells in which data is over-erased, memory cells which do not need to be rewritten are not rewritten. Only the memory cells to be rewritten are rewritten and excessive rewrites do not occur, therefore, the process time for the total erasure process can be shortened in comparison to the conventional process time. Furthermore, since the width of the threshold voltage distribution can be narrowed more than the conventional width of a threshold voltage distribution, sufficient read margins remain and a non-volatile semiconductor memory which is suitable for low power-supply voltage operation can be obtained with no additional manufacturing processes or the like.

A third aspect of the present invention is a non-volatile semiconductor memory according to the second aspect, wherein the first erase determination level may be set higher than the desired erase determination level for an amount of increased voltage when the threshold voltage of the memory cells not erased excessively increases during rewriting by the first rewriting means.

Furthermore, in the second aspect of the present invention, data in the memory cells is erased up to the first erase determination level which is higher than the desired erase determination level when data in the memory cells is totally erased. According to the third aspect of the present invention, to perform this erasure, as shown in the third aspect of the present invention, for example, for the case where the amount of increased voltage when the threshold voltage of the memory cells in which data is not over-erased increases by rewriting the memory cells in which data is over-erased, the first erase determination level may be set higher than the desired erase determination level. Accordingly, the memory cells having a threshold voltage between the desired erase determination level and the first erase determination level can be totally rewritten when the second rewrite is performed.

A fourth aspect of the present invention is a non-volatile semiconductor memory comprising a non-volatile memory cell which is capable of being written to and totally erased electrically and in which a threshold voltage distribution of the memory cell is effected by memory cells in which data is over-erased, wherein the memory is provided with: an erasing means for totally erasing erasable memory cells up to a desired erase determination level, a first rewriting means for rewriting memory cells in which data is over-erased by totally erasing up to a first rewrite determination level lower than a desired rewrite determination level while simultaneously verifying each memory cell, and a second rewriting means for rewriting memory cells not rewritten up to the desired rewrite determination level while verifying for each memory cell after the first rewrite.

According to the fourth aspect of the present invention, the effects of the first and second aspects can be obtained as well, and the erasure may be performed once. Therefore, the control for erasing can be simplified and the process time for the total erasure process can be shortened in comparison to the conventional process time.

A fifth aspect of the present invention is a non-volatile semiconductor memory according to any one of the second to fourth aspects, wherein the first rewrite determination level may be set lower than the desired rewrite determination level for an amount of increased voltage when the threshold voltage of the memory cells in which data is not over-erased increases during rewriting by the first rewriting means.

Furthermore, according to the second and fourth aspects of the present invention, the first rewrite is performed up to the rewrite determination level which is lower than the desired rewrite determination level. To perform this rewriting, as shown in the fifth aspect of the present invention, for example, when the amount of increased voltage when the threshold voltage of the memory cells in which data is not over-erased increases by rewriting the memory cells in which data is over-erased, the first rewrite determination level may be set lower than the desired rewrite determination level used when the first erase is performed. Therefore, there is no effect such as that the threshold voltage distribution seems to decrease due to the memory cells in which data is over-erased and only the memory cells to be rewritten are rewritten.

A sixth aspect of the present invention is a non-volatile semiconductor memory according to any one of the first to fifth aspects, wherein a rewrite control voltage to be applied to the memory cells when the first rewrite determination means is performed is higher than a rewrite control voltage to be applied to the memory cells when the second rewrite determination means is performed.

According to the sixth aspect of the present invention, the rewrite control voltage which is applied to the memory cell for the first rewrite is higher than the rewrite control voltage for the second rewrite. Therefore, the number of times for writing when the memory cells having deep depletion are rewritten by the first rewrite can be decreased, and the erase current for the rewriting can be reduced.

A seventh aspect of the present invention is a non-volatile semiconductor memory according to any one of the first to sixth aspects, wherein a read control voltage for verifying to be applied to the memory cells when verifying while rewriting is higher than a read control voltage to be applied during normal reading by the first rewriting means or the second rewriting means.

According to the seventh aspect of the present invention, when verifying is performed in the first rewriting, the read control voltage which is applied to the memory cells is higher than the read control voltage when normally reading. Therefore, the amount of current which flows in the memory cells for verifying can be increased. As a result, the effect of the leakage current flowing into the memory cells in which data be over-erased can be almost ignored, and the memory cells which are in the depletion state and require rewriting can be more accurately determined.

A eighth aspect of the present invention is a non-volatile semiconductor memory according to any one of the first to seventh aspects, wherein the first rewriting means or the second rewriting means detects, for each digit line, whether there are memory cells in which data is over-erased in the digit line for rewriting, and verifies and rewrites the digit line for each memory cell only when the there are memory cells in which data is over-erased.

According to the eighth aspect of the present invention, after detecting whether there are memory cells in the digit line in which data is over-erased, the digit line is verified and rewritten for each memory cell. For digit lines which are not connected to the memory cells in which data is over-erased, it is not necessary to determine whether a rewrite for each memory cell is required. Therefore, the time for the process can be reduced.

A ninth aspect of the present invention is a non-volatile semiconductor memory according to any one of the first to eighth aspects, wherein the first rewriting means or the second rewriting means rewrites the memory cells which are to be rewritten to the mean of the threshold voltage distribution of the memory cells in which data is not over-erased.

According to the ninth aspect of the present invention, the data of the memory cells for rewriting is rewritten around the mean value of the threshold voltage distribution of the memory cells in which data is not over-erased. As a result, the threshold voltage distribution can have a peak voltage and keep its shape. Furthermore, when the second erase operation is performed, the probability that data of the memory cells is in the depletion state can be decreased.

A tenth aspect of the present invention is a non-volatile semiconductor memory comprising a non-volatile memory cell which is capable of being written to and totally erased electrically and in which a threshold voltage distribution of the memory cell is affected by data in memory cells in which data is over-erased, wherein only the memory cells in which data is over-erased are detected in memory cells for erasure and rewritten to a desired threshold voltage, and then further rewritten to a desired threshold voltage distribution.

According to the tenth aspect of the present invention, only memory cells in which data is over-erased are detected, are rewritten up to the predetermined threshold voltage distribution, and further, are rewritten up to the desired threshold voltage distribution. As a result, the effects of the first and second aspects can be obtained as well.

An eleventh aspect of the present invention is a non-volatile semiconductor memory comprising a non-volatile memory cell which is capable of being written to and totally erased electrically and in which a threshold voltage distribution of the memory cell is affected by data in memory cells in which data is over-erased, wherein a threshold voltage distribution of memory cells for erasure, which seems to be at lower position owing to the memory cells in which data is over-erased is restored to an actual threshold voltage distribution and then rewritten to a desired threshold voltage distribution.

According to the eleventh aspect of the present invention, the threshold voltage distribution which seems to be at lower position owing to the memory cells in which data is over-erased is restored to the actual threshold voltage distribution and then rewritten up to the desired threshold voltage distribution. As a result, the effects of the first and second aspects can be obtained as well.

DETAILED DESCRIPTION OF THE INVENTION (Basic Concepts)

Embodiments of the present invention will be explained with reference to the figures as follows. First, a technical concept which is the basis of an erasure process according to the present invention will be explained with reference to FIG. 2. As an example of a non-volatile semiconductor memory device, a flash memory is given. Furthermore, in FIG. 2, the same reference letters are used with regard to the distributions as are used in FIG. 8.

In the present invention, an erasure process for the erasure block is divided into two steps, that is, a "first step" and a "second step" as mentioned later, and performed. In each step, erasing and rewriting are performed. The rewrite determination level and the erase determination level are set for each step. The "rewrite determination level" referred to indicates a level at which a rewrite is performed when the threshold voltage of memory cells having deep depletion is lower than this level in order to put the threshold voltage equal to or above this rewrite determination level. On the other hand, the "erase determination level" indicates a level so as to make the threshold voltage equal to or less than the erase determination level by erasing the memory cells having a threshold voltage higher than the erase determination level.

In the document JP 8-106793 mentioned above, it is determined whether a "deplete verifying voltage", which corresponds to the rewrite determination level of the present invention, is simply applied to the word line and rewritten. On the other hand, in the embodiment of the present invention mentioned later, the rewrite determination level is not simply applied to the word line. That is to say, the rewrite determination level of the embodiment of the present invention indicates an intermediate value of the threshold voltage between the memory cell which is to be rewritten and the memory cell which is not to be rewritten.

Figure 2:
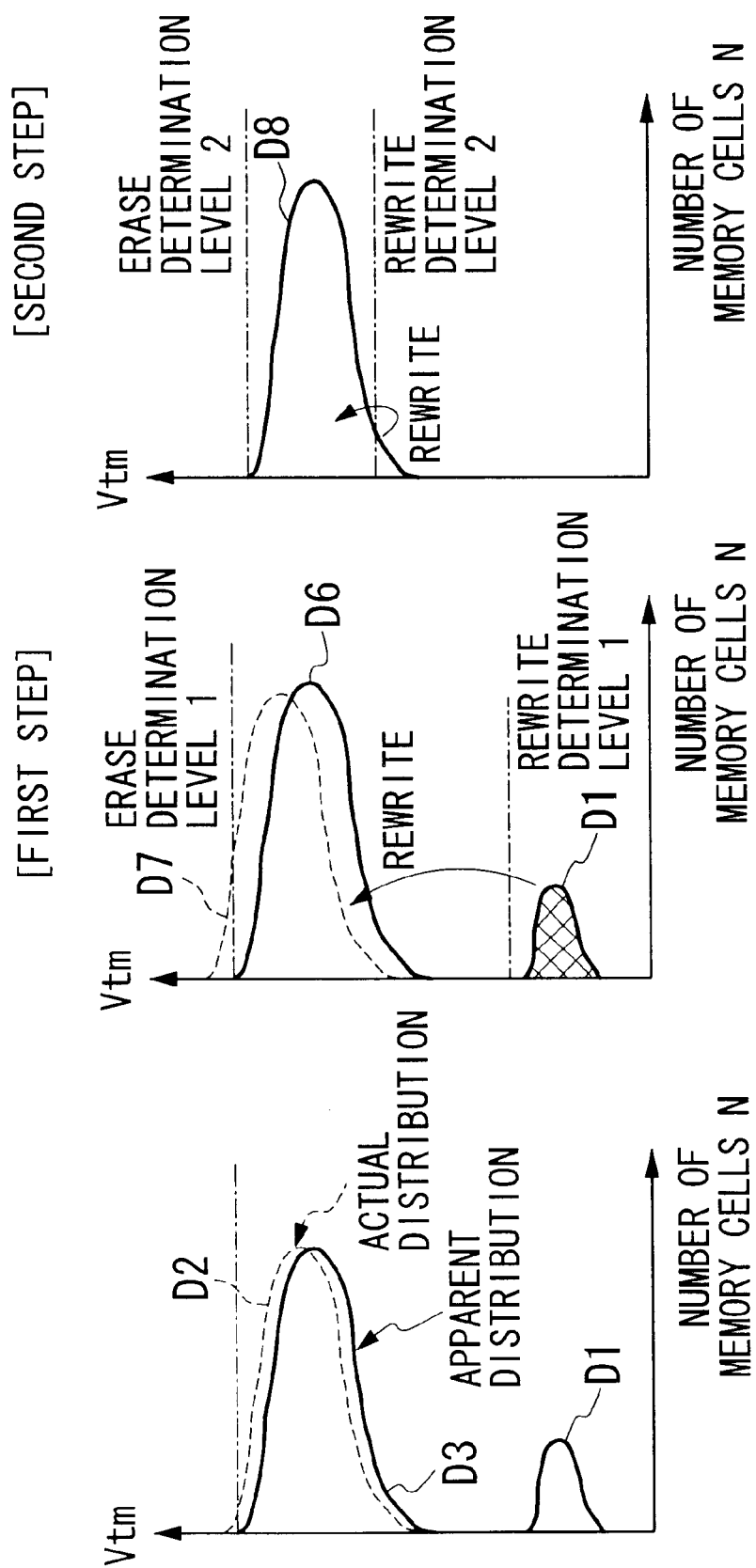
FIG. 2 is a diagram explaining an erase operation of the flash memory and a transition state of the threshold voltage distribution of the memory cells for erasure according to the first aspect of the present invention.
Figure 8:
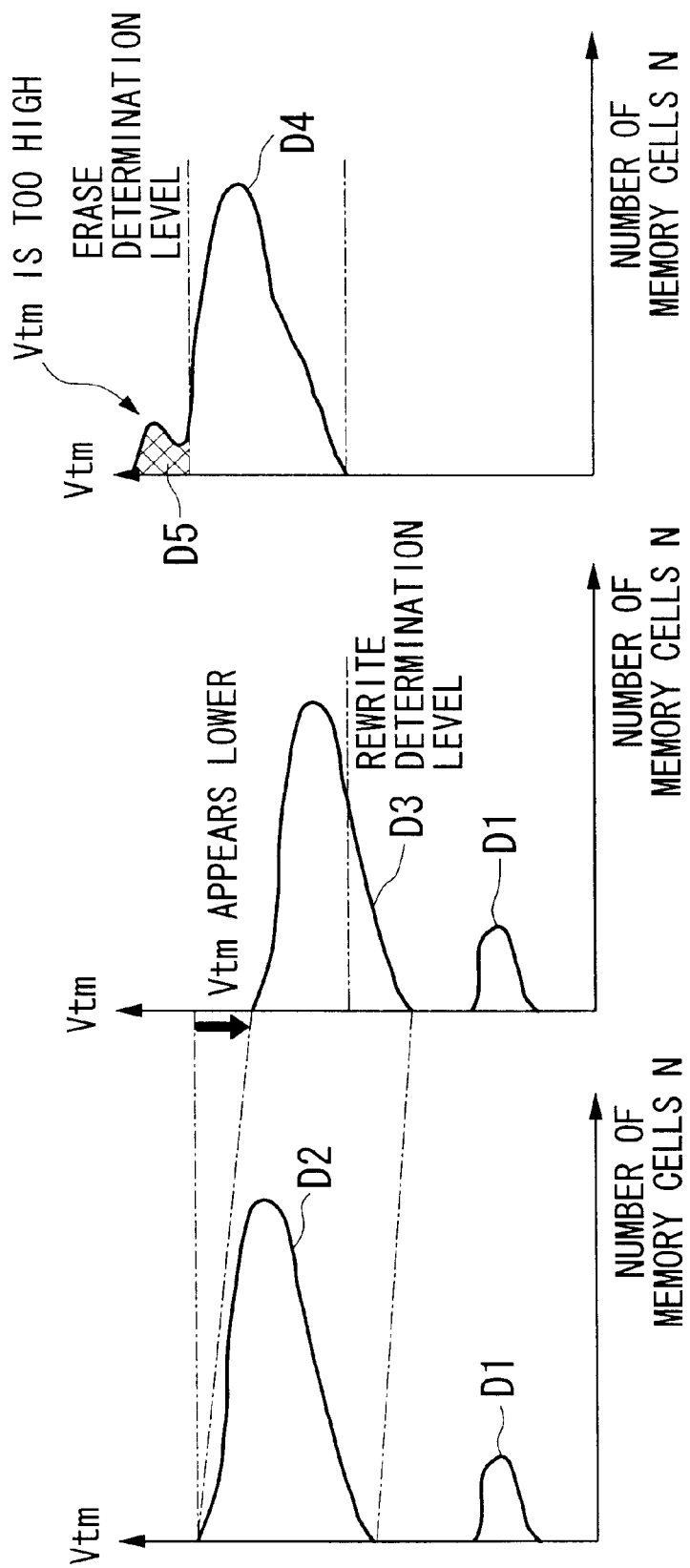
FIG. 8 is a graph explaining an erase operation of a conventional flash memory and a transition state of a threshold voltage distribution of memory cells for erasure.

The graph on the left in FIG. 2 simply shows an overlap of distributions D1 to D3 of FIG. 8. The graph in the center of FIG. 2 shows an operation when the first step is performed. The graph on the right in FIG. 2 shows an operation when the second step is performed. The threshold voltage distribution of the erasure block is erased so as to be between "rewrite determination level 2" and "erase determination level 2".

In the first step, using "erase determination level 1" which is higher than "erase determination level 2", it is determined whether the erasing of the erasure block has been completed (hereinafter, this determination will be called "erase/verify"). Subsequently, it is determined whether rewriting of the block for erasure has been completed (hereinafter, this determination will be called "rewrite/verify"). Then, in consideration of the fact that the threshold voltage is apparently at a lower position due to memory cells having deep depletion, rewriting and verifying are performed using "rewrite determination level 1" which is set lower than "rewrite determination level 2".

Through the process of this first step, only memory cells in which data is over-erased can be rewritten within the threshold voltage distribution of the memory cell in which data is normally erased. As a result, distribution D1 is erased from the distribution having a wide width composed of distributions D1 and D6 shown in the graph at the center of FIG. 2 resulting in a distribution having a narrow width. Since memory cells having deep depletion are completely erased by the rewrite/verify, the phenomenon in which the threshold voltage distribution seems to be at a lower position is avoided and the actual distribution appears. The distribution having a narrow width, as mentioned above is higher than the threshold voltage distribution before rewriting as shown by the distribution D7 in the graph at the center of FIG. 2. When memory cells having deep depletion are rewritten by the first step, rewriting is performed so as to achieve the mean of distribution D6 (or around the peak of D6) as a target so that the threshold voltage distribution of the memory cell can have the shape like that shown in distribution D7 of FIG. 2.

In the second step, erasing and rewriting are performed using the desired determination level. That is, the erase/verify of the first step is performed as well using "erase determination level 2", so that the threshold voltage distribution is determined as shown by distribution D8 in the graph on the right of FIG. 2. Subsequently, to erase the memory cells in which data is slightly over-erased (hereinafter, this memory cell will be called a "memory cell having shallow depletion") by the erase/verify, the rewrite/verify of the first step is performed as well using "rewrite determination level 2".

Therefore, in the second step, with regard to the memory cells having a higher threshold voltage than the upper limit of the desired threshold voltage distribution, further erasing is performed so that the threshold voltage is lower than the upper limit. With regard to memory cells having a lower threshold voltage than the lower limit of the desired threshold voltage distribution, rewriting is performed so that the threshold voltage is within the desired threshold voltage distribution. Accordingly, the threshold voltage distribution of the erasure block can be kept within the desired threshold voltage distribution.

In the document JP 8-106793 mentioned above, every memory cell connected to one digit line is rewritten and verified when the first rewrite/verify is performed. If the memory cells are connected to the same digit line when the memory cells which are to be rewritten and the memory cells which are not to be rewritten are mixed, the memory cells which are not to be rewritten will be rewritten. Therefore, the threshold voltage distribution increases as a whole. On the other hand, in the present invention, since the rewrite/verify is performed for each memory cell in both the first and second steps, only memory cells which are to be rewritten can be rewritten.

"Rewrite determination level 1" used in the first step is lower than "rewrite determination level 2" used in the second step. This is because the threshold voltage distribution decreases due to memory cells having deep depletion as mentioned above, so that the memory cells which are not to be rewritten may actually be rewritten. Furthermore, "erase determination level 1" used in the first step is higher than "erase determination level 2" used in the second step. This is because the threshold voltage distribution which is apparently at a lower position due to the memory cells having deep depletion increases above the actual threshold voltage distribution "erase determination level 1", so that the memory cells having a threshold voltage between "erase determination level 2" and "erase determination level 1" are rewritten by the erase/verify in the second step.

Figure 4:
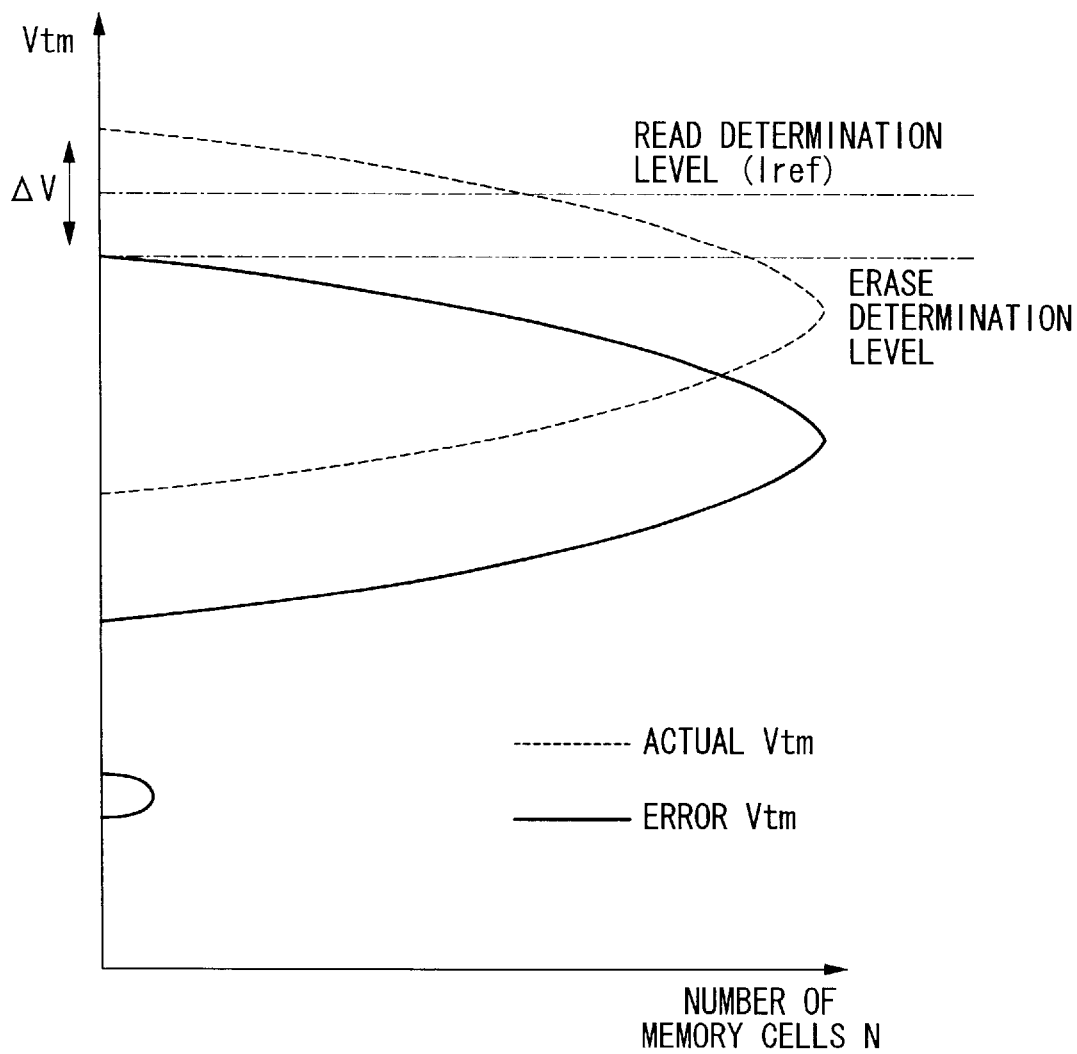
FIG. 4 is a diagram explaining an apparent threshold voltage distribution of every memory cell in an erasure block.

The voltage difference between "erase determination level 1" and "erase determination level 2" and the voltage difference between "rewrite determination level 1" and "rewrite determination level 2" are each given by $\Delta V$. The value $\Delta V$ is defined as the voltage difference between the upper value of the threshold voltage in the apparent distribution ("error Vtm" in FIG. 4) and the upper value of the threshold voltage in the actual distribution ("actual Vtm" in FIG. 4) as shown in FIG. 4. Of course, it may be difficult to measure the actual threshold voltage in the distribution. Therefore, the ratio of the memory cells having deep depletion in the memory cell array is calculated by a simulation and the degree of shift of the threshold voltage distribution by the memory cells having deep depletion is calculated in order to determine the value $\Delta V$.

Figure 3:
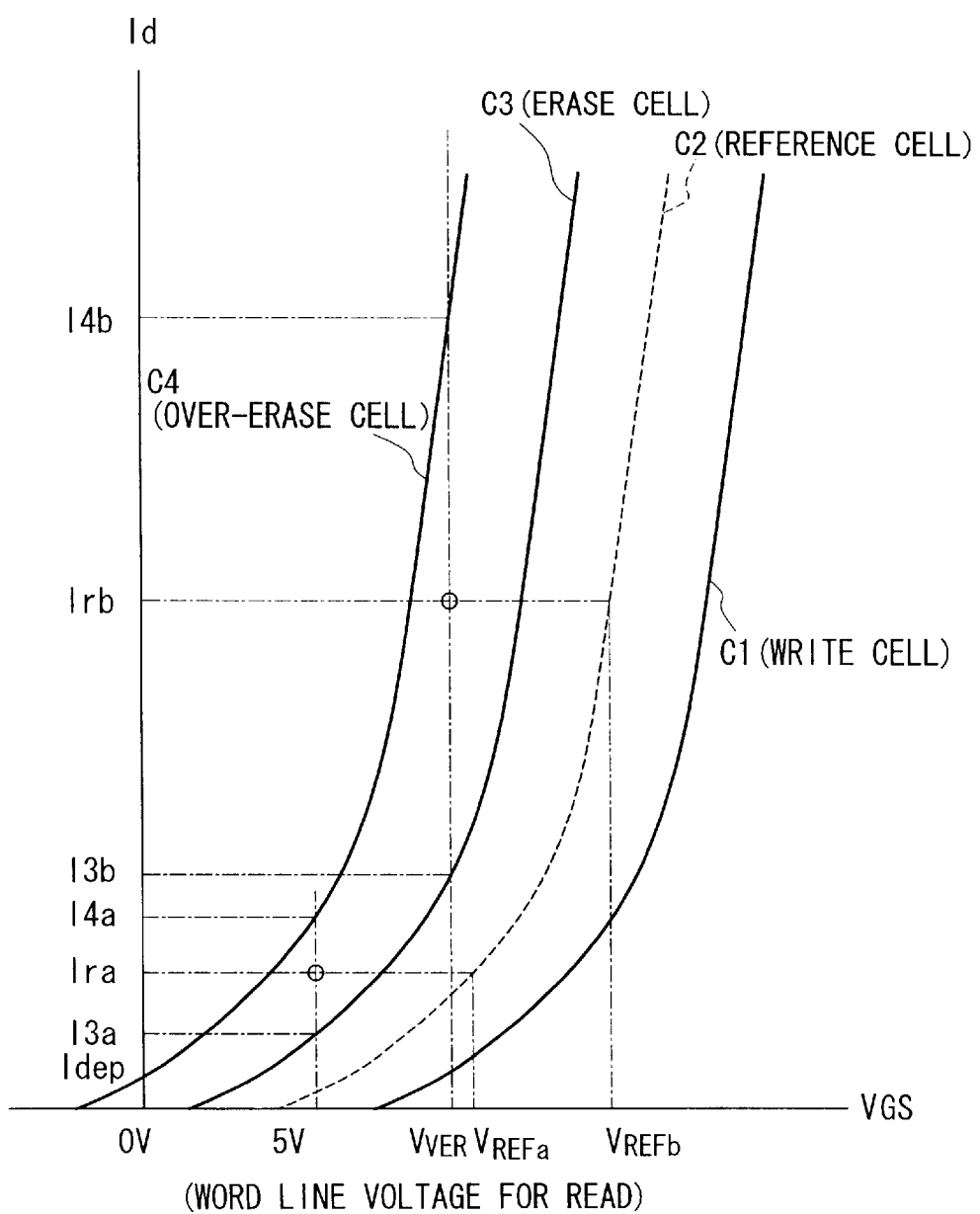
FIG. 3 is a characteristic diagram showing the relationships between a voltage of a control gate and source for a memory cell, and a drain current for each state of a reference cell and a memory cell (write state, erase state, and over-erase state).

Furthermore, in the present invention, a voltage applied to the word line is greater than the voltage of the word line which is used in a normal read when the rewrite/verify is performed. The reason will be explained with reference to FIG. 3 as follows. In FIG. 3, the X-axis represents a voltage between gate and source $V_{GS}$ applied to the memory cell between the control gate and the source, and the Y-axis represents a drain current Id. Reference letter C1 indicates the $V_{GS}$-Id characteristic of the write cell in the write state; reference letter C2 indicates the $V_{GS}$-Id characteristic of a reference cell 6 (see FIG. 1); reference letter C3 indicates the $V_{GS}$-Id characteristic of the erase cell in the normal erase state; and reference letter C4 indicates the $V_{GS}$-Id characteristic of the memory cell having deep depletion. According to FIG. 3, these are characterized by exponential shapes. Characteristic C2 shows the characteristic of the reference cell when normally reading, and the threshold voltage is situated between characteristic C1 and characteristic C3 so as to distinguish the write cell and the erase cell.

To perform the rewriting only for memory cells having deep depletion, it is sufficient that the memory cells having deep depletion and the memory cells in which data is normally erased are distinguished. It is sufficient that the amount of the current Iref passing through reference cell 6 is situated between characteristic C3 and characteristic C4. For example, the voltage between gate and source $V_{GS}$ of the memory cells, as well as the voltage when normally reading, is set to 5 V, for example. As a result, the amount of current passing through the memory cell in which data is normally erased and the memory cell having deep depletion is obtained, by characteristics C3 and C4 corresponding to the voltage between gate and source $V_{GS}$, to be I3a and I4a, respectively. Therefore, for example, when the amount of current Ira passes through the reference cell 6, the voltage between gate and source $V_{GS}$ applied to the control gate of the reference cell 6 is set to the voltage $V_{REFa}$. Moreover, the amount of current is given by to Iref=Ira when 5V is applied to the voltage between gate and source $V_{GS}$ by controlling the threshold voltage of reference cell 6.

Figure 9:
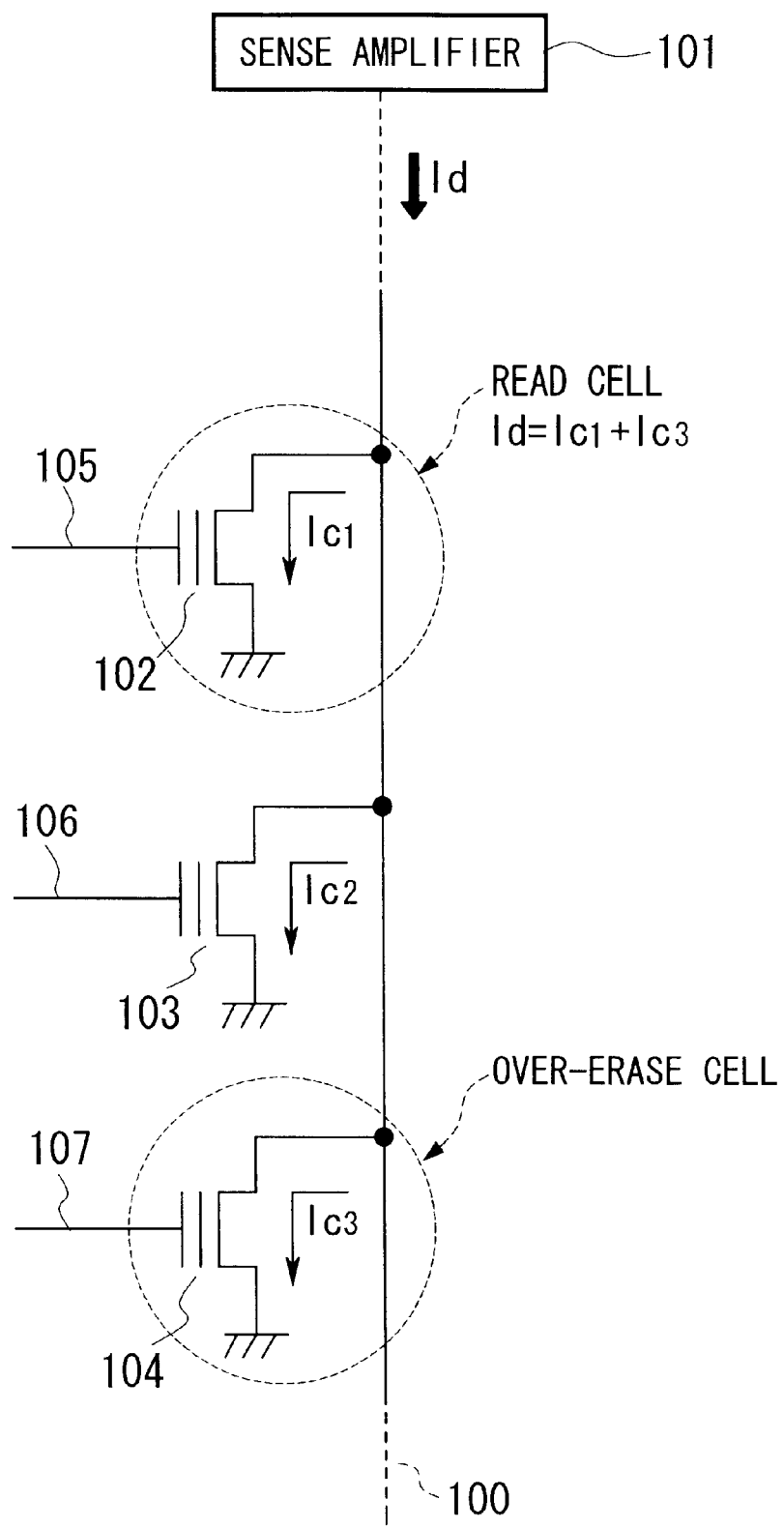
FIG. 9 is a diagram explaining the increase of an amount of current flowing in a digit line by memory cells having deep depletion.

As mentioned above, even if the voltage is not applied to the control gate (the voltage between gate and source $V_{GS}$=0) in the memory cell having deep depletion, the amount of current corresponding to the amount of current Idep shown in FIG. 3 passes through the memory cell. Therefore, if the memory cell having deep depletion, for example, only one memory cell, is connected to the digit line comprising the memory cells in which data is normally erased, the amount of current (corresponding to Id shown in FIG. 9) passing through the digit line when memory cells are selected in which data is normally erased is I3a+Idep.

If the amount of current I3a+Idep is greater than the amount of current Ira, the memory cells in which data is normally erased and the memory cells having deep depletion cannot be distinguished because of the memory cell having deep depletion which is connected to the digit line as mentioned above. That is, if voltage $V_{GS}$ between gate and source is low, such as 5 V, the effect of the memory cells having deep depletion cannot be ignored because the proportion of the amount of current Idep is greater than the amount of current I3a. When the memory cells having deep depletion are multi-connected to the same digit line, each amount of current is remarkably affected by the memory cells having deep depletion.

On the other hand, if voltage $V_{GS}$ between gate and source is set to be larger than 5 V, for example, $V_{VER}$, each amount of current passing through memory cells in which data is normally erased and memory cells having deep depletion is I3b by characteristic C3 and I4b by characteristic C4, respectively. Therefore, the amount of current passing through the above-mentioned digit line is I3b+Idep. Furthermore, since the amount of current between amounts of current I3b and I4b, for example, Irb, passes through the reference cell 6, voltage $V_{GS}$ between gate and source in the reference cell 6 is set to $V_{REFb}$ or the threshold voltage of the reference cell 6 is adjusted so as to pass the amount of current Irb by voltage $V_{VER}$.

As mentioned above, since the $V_{GS}$-Id characteristics are like an exponential function (second-degree function), the value of I4b-I3b is remarkably greater than the value of I4a-I3a. In FIG. 3, the value of I4b-I3b is several times the value of I4a-I3a; however, in actuality, the difference of them is even larger. In the rewrite/verify in the first step, the voltage $V_{GS}$ between gate and source is set equal to or greater than the voltage $V_{VER}$, so that the amount of current Idep passing through the memory cells having deep depletion can be sufficiently low in comparison with the amount of current passing through the erase cell or over-erase cell. Practically, the effect of the memory cells having deep depletion can be ignored. Since there is no possibility that the amount of current I3b+Idep is greater than the amount of current Irb, the memory cells in which data is normally erased and the memory cells in which data is over-erased can be accurately distinguished.

In the rewrite/verify in the second step, since the memory cells having deep depletion are removed in the first step, the problem such that each memory cell cannot be distinguished does not occur even if a voltage of approximately 5 V is applied to voltage $V_{GS}$ between gate and source of memory cell as is done in the normal read. Therefore, the voltage applied to the word line and the voltage applied to the control gate of reference cell 6 may be decreased depending on the voltage $V_{GS}$ between gate and source. Furthermore, the voltage $V_{GS}$ between gate and source may be given by voltage $V_{VER}$. In the second step, since the rewrite/verify is performed for the memory cells having shallow depletion which have greater threshold voltages than the memory cells having deep depletion, its characteristic is closer to characteristic C3 than characteristic C4. Therefore, the amount of current Iref may be decreased by setting voltage $V_{GS}$ between gate and source of reference cell 6 so as to be lower than voltage $V_{REFb}$ or the threshold voltage of reference cell 6 may be adjusted.

As mentioned above, since the memory cells having deep depletion are rewritten first and then the memory cells having shallow depletion are rewritten, the problem wherein the threshold voltage distribution is apparently low does not occur at the time when the memory cells having shallow depletion is rewritten. Therefore, unnecessary rewrites do not occur, and the process time for the total erasure process can be shortened in comparison to the conventional process time. Furthermore, the threshold voltage distribution can be narrower than the conventional distribution, so that a sufficient read margin can be obtained and a flash memory, which is suitable for low power-supply voltage operation, can be obtained without an improvement of the manufacturing method. Moreover, when data of the memory cells is erased up to "erase determination level 1", over-erased memory cells are rewritten. Therefore, the number of memory cells can be remarkably decreased, and as a result, the necessary time for erasing can be remarkably reduced.

First Embodiment (1) Explanation of the Structure

Next, a structure of the flash memory will be concretely explained in order to actualize the above-mentioned concepts.

Figure 1:
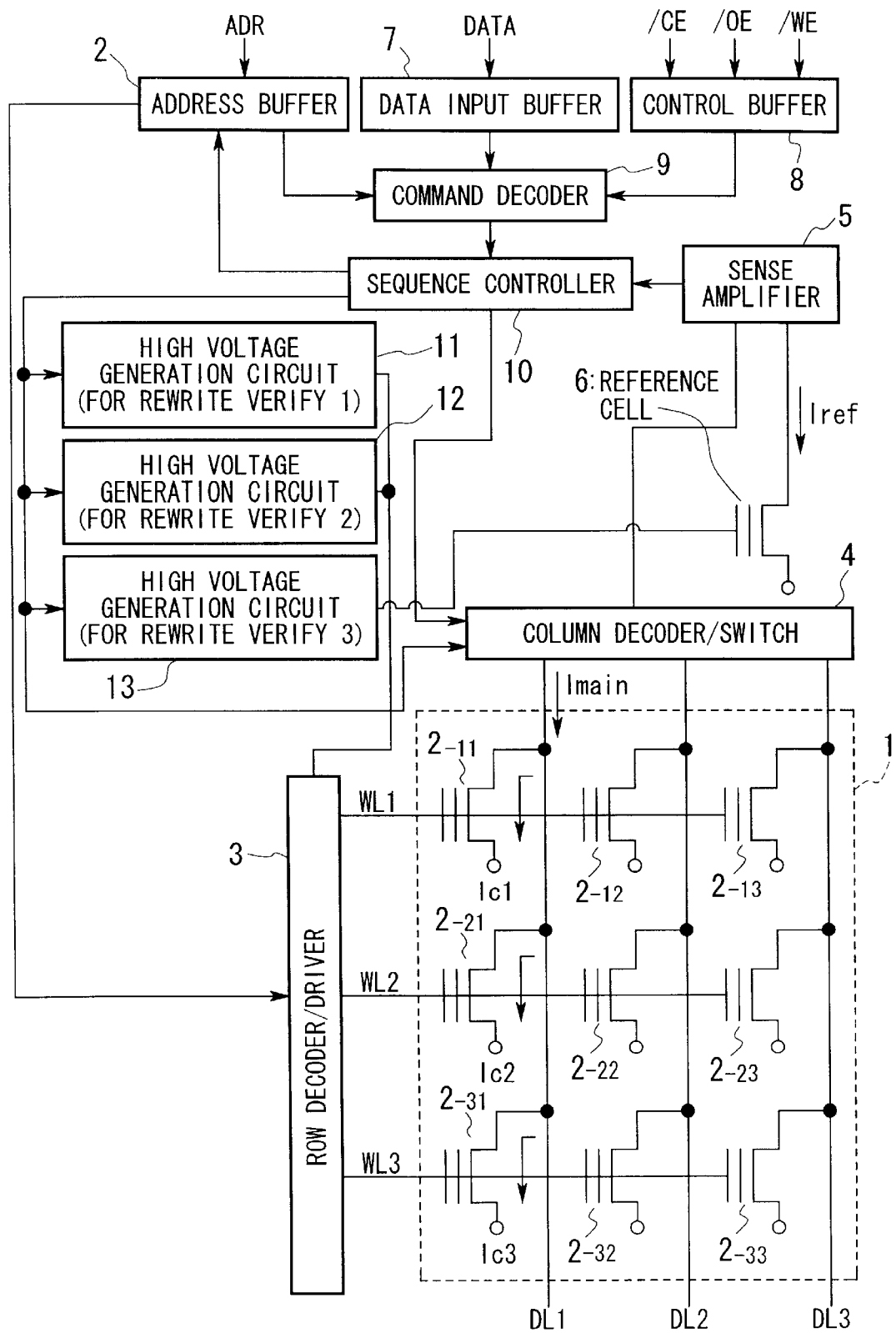
FIG. 1 is a block diagram showing a flash memory according to the first aspect of the present invention.

FIG. 1 is a block diagram showing a flash memory according to the embodiment. A flash memory in which memory cells are connected to the digit line in parallel, which is called an NOR-type flash memory, is illustrated in FIG. 1. In FIG. 1, a memory cell array 1 is composed of nine memory cells 2-11 to 2-13, 2-21 to 2-23, and 2-31 to 2-33 which are situated like a matrix. Each memory cell is situated at cross points of the word lines WL1 to WL3 and the digit lines DL1 to DL3, respectively.

For convenience, memory cell array 1 is composed of 3 rows×3 columns; however, memory cell array 1 is actually composed of many rows (word lines) and many columns (digit lines) as a matter of course. Furthermore, each memory cell has the same structure as the memory cells adopted in general flash memory, and is provided with a source terminal and a drain terminal, and further, a control gate having a laminate gate structure, and a floating gate. Each memory cell has a well which is commonly used for a predetermined block as an erase unit, and a power supply from a well bias circuit (not shown) is applied into this common well. Moreover, the control gate of each memory cell array is connected to the corresponding word line, and the drain terminal is connected to the corresponding digit line. The source terminal of each memory cell is connected to a ground electric potential via a switch (not shown). When data of the memory cells is erased, this switch is turned OFF and the source terminal is in an open state.

Address buffer 2 buffers and outputs an address ADR which is provided from outside the flash memory or an address provided by a sequence controller (described below). These addresses are composed of a row address and a column address; the above-mentioned word lines WL1 to WL3 correspond to the row addresses respectively, and the digit lines DL1 to DL3 correspond to the column addresses respectively.

Row decoder driver 3 decodes the row address part in the address which is input by address buffer 2, and one of the word lines WL1 to WL3 which is specified in the row address is activated. Then, the voltage input by a high-voltage generation circuit 11 or a high-voltage generation circuit 12 (both will be described below) is applied to the selected word line by operating row decoder driver 3.

Column decoder switch 4 decodes the column address part in the address which is input by address buffer 2, and one of the digit lines selected from the digit lines DL1 to DL3 according to the result of the decoded column address part is connected to a sense amplifier 5. Then, the amount of current passing through the digit line selected by column decoder switch 4 and the amount of current Iref, which is a standard amount of current passing through reference cell 6, are compared by operating sense amplifier 5. Furthermore, holding data of the memory cell selected by the address ADR is then output as a sense result.

As mentioned above, word lines WL1 to WL3 are determined so as to be applied a voltage of approximately 5 V between the gate and the source of the memory cell during a normal read. If the memory cell is a write cell (logic value 0), the threshold voltage is high, and then, current hardly passes into the memory cell even if a voltage of approximately 5 V is applied between the gate and the source of the memory cell. On the other hand, if the memory cell is an erase cell (logic value 1), the threshold voltage is low, and then, current passes into the memory cell by applying a voltage of approximately 5V between the gate and the source of the memory cell. For example, if a normal read from the memory cell is performed, the characteristic of reference cell 6 is determined to be characteristic C2 of FIG. 3, and the amount of current obtained from characteristic C2 is set to the amount of current Iref passing through reference cell 6 when $V_{GS}=5$ V is applied between the gate and the source. Accordingly, if the amount of current passing through the digit line is equal to or greater than the amount of current Iref, data in the memory cell is "0", and further, if the amount of current is lower than Iref, data in the memory cell is "1".

Output data from sense amplifier 5 is buffered and output to an external device using a data output buffer (not shown) in the same way as is done in a general flash memory. However, an explanation for this operation is not needed for the present invention, so the data output buffer is not shown in particular. Furthermore, only one sense amplifier is shown in FIG. 1 in order to simplify the figure; however, in actuality, a number of sense amplifiers for a bit width of data (for example, 8 bits) is provided, wherein the data is simultaneously input and output between the sense amplifier and an external device.

Next, each memory cell of reference cell 6 has a structure of each memory cell as mentioned above as well. As the voltage is supplied to the control gate from a high-voltage generation circuit 13, the amount of current Iref of the drain current is controlled. The circuit structure necessary to apply the amount of current Iref to sense amplifier 5 is not limited to the structure using reference cell 6, and a structure using constant current circuit or the like may also be used. Data input buffer 7 performs buffering of data "DATA" which is supplied from outside the flash memory and then outputs the data. The data DATA which is applied to the buffer can be data to be rewritten to the memory cell itself, data for specifying a command to the flash memory, and the like.

In order to control accesses of the flash memory, a control buffer 8 performs buffering to various control signals which are input from outside and then control signals are output. The input signals are the same as those used in general flash memory, such as a chip enable signal (CE), an output enable signal (OE), a write enable signal (WE), and the like, as well as a reset signal and the like, and are input into the control buffer 8. A command decoder 9 incorporates and decodes addresses and data which are supplied from address buffer 2 at the timing indicated by a control signal supplied from the control buffer 8. Furthermore, command types specified by this decoding and parameters are sent to the sequence controller 10. The parameters can be block addresses and block length for data which is erased per each block, and the like.

Next, sequence controller 10 is a central part controlling operations with regard to the erase/verify and the write/verify by controlling high-voltage generation circuits 11 to 13 based on command types and parameter output from command decoder 9, and the sense results which are supplied from sense amplifier 5. Details of the functions of sequence controller 10 will be explained later and are not explained in detail here.

Furthermore, high-voltage generation circuit 11 supplies the voltage which is to be applied to the word line by the rewrite/verify in the first step to row decoder driver 3. Similarly, high-voltage generation circuit 12 supplies the voltage which is to be to applied to the word line by the rewrite/verify in the second step to row decoder driver 3. On the other hand, high-voltage generation circuit 13 generates the voltage which is to be applied to the control gate of reference cell 6 in the rewrite/verify in the first and second steps. As an example of the concrete structure of high-voltage generation circuits 11 to 13, a plurality of resistive elements are arranged in series between a power-supply potential and a ground potential and then resistive-divided so as to generate and supply a desired voltage according to the position in a connection node of adjacent resistive elements.

(2) Explanation of the Operation

1. Input of the Erase Command

The erase operation in the flash memory comprising the above-mentioned structure will be explained as follows with reference to the timing chart shown in FIG. 5

At first, according to the combination of each level of the chip enable signal (CE), the output enable signal (OE), and the writing enable signal (WE), and the combination of the value of address ADR and the value of data DATA, the erase command is specified from the outside of the flash memory. When only a specific block is to be erased, the erasable block is specified using the address ADR. Then, command decoder 9 recognizes the erase command as specified by incorporating the above-mentioned signals from address buffer 2, data input buffer 7, and control buffer 8 and address ADR and data DATA, and further, command decoder 9 sends the commend type with its parameters to sequence controller 10. Sequence controller 10 starts the sequence of the erase operation therein according to the erase command's type and its parameters. Furthermore, when the erase is performed per each block, sequence controller 10 generates an erase start address and the erase termination address of the erasable block for the row and the column, and these addresses are stored in a register. Moreover, in the present embodiment, it is presumed that the memory cell connected to digit lines DL2 and DL3 is specified as the erasable block.

2. Prewrite

Next, sequence controller 10 is performed a prewrite so that all memory cells in the erasable block is in prewrite (step S1). That is, since there are both memory cells in write state and in erase state in memory cell array 1 when the erase command is specified, these erasable memory cells are in write state by performing the write to the erasable memory cells. Since the prewrite itself does not relate to the main subject matter of the present invention directly and its detailed operation is similar to a rewrite operation (see FIG. 6) which will be explained later, the prewrite will be explained after explaining the rewrite operation.

3. The first Erase/Verify

Figure 5:
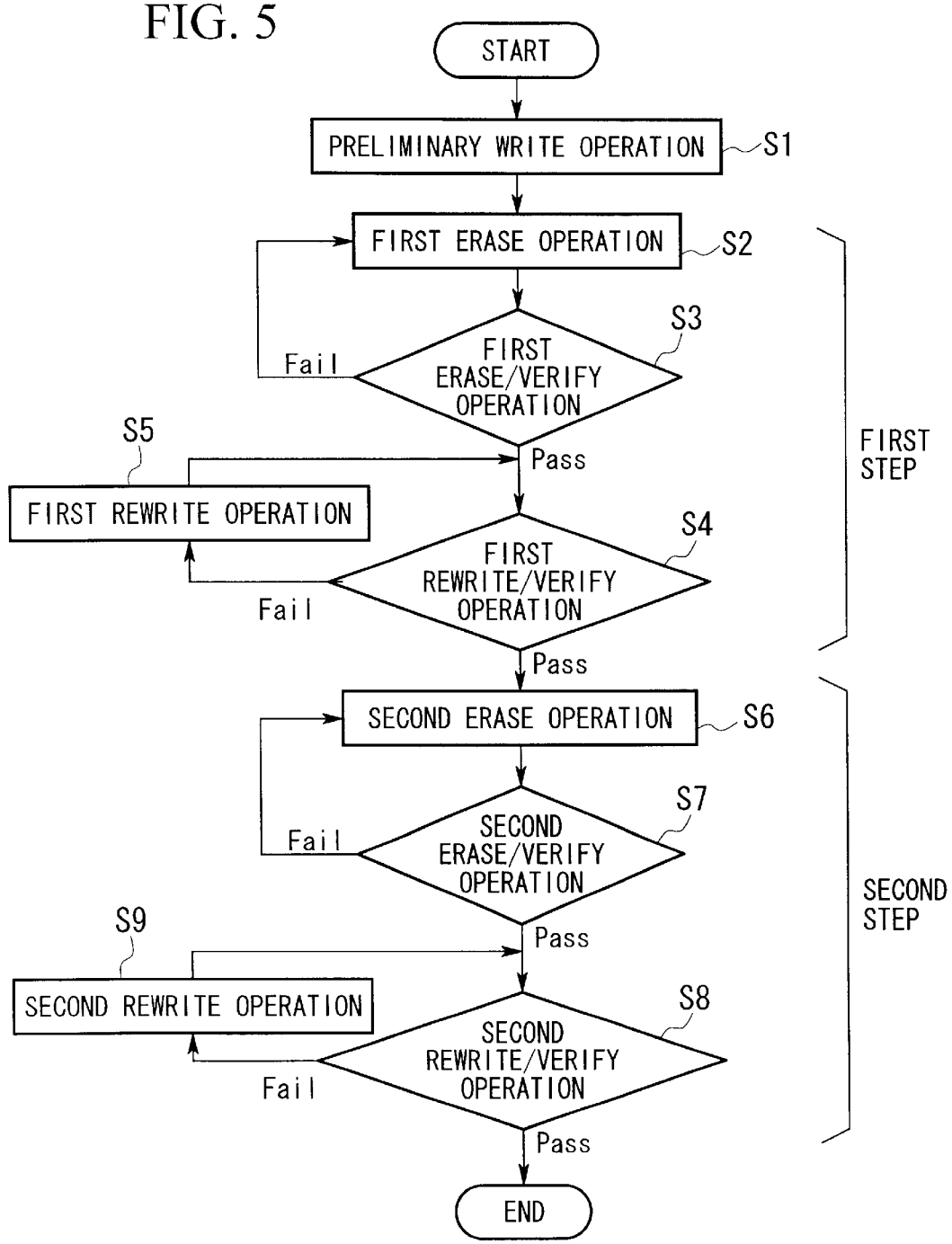
FIG. 5 is a flowchart showing the steps of the erase operation of the flash memory according to the first aspect of the present invention.

Sequence controller 10 is performed the first erase/verify by shifting "the first step" of FIG. 5. Since the sequence controller controls the high-voltage generation circuit, the well bias circuit, column decoder switch 4, and a switch (not shown), the high-voltage generation circuit generates a gate voltage for erase, for example, −10 V, to be applied to the word line and supplies row decoder driver 3. Row decoder driver 3 supplies the gate voltage for erase which is supplied by the high-voltage generation circuit 11 to each word line for each erasable block (the word lines WL1 to WL3 in this embodiment).

Furthermore, the well bias circuit supplies an erasable well voltage, for example, 7 V, to a common well for each erasable block. Moreover, an inner switch in column decoder switch 4 is turned OFF, so that each drain terminal of each memory cell in memory cell array 1 is in open state. Then, each source terminal of each memory cell is also in open state by turning OFF the switch (not shown). As a result, all memory cells in the erasable block 2-12, 2-13, 2-22, 2-23, 2-32, and 2-33 are erased as well as the conventional flash memory (step S2). As well as conventional flash memory, since the erase operation in the step S2 is repeated intermittently the erase per predetermined time so as to be gradually proceeded, it is confirmed whether all memory cells in the erasable block are in erase state by performing the verify after the erase per predetermined time.

Concretely, it is confirmed whether the threshold voltages of each memory cell in the erasable block is equal to or lower than the "erase determination level 1" by the verify as mentioned above (step S3). Sequence controller 10 updates the row address part and the column address part of the address supplying to address buffer 2 within the erasable block and simultaneously, the memory cells are selected in order. Sequence controller 10 operates to the selected memory cells as follows.

Since sequence controller 10 controls high-voltage generation circuits 11 and 13, high-voltage generation circuit 11 generates the word line voltage which is equal to the "erase determination level 1" and supplies the word line voltage to row decoder driver 3. High-voltage generation circuit 13 supplies the voltage to the control gate of reference cell 6 so as to pass through the amount of current Iref in reference cell 6. The amount of current Iref is set a little greater than the total amount of current passing through the memory cells having deep depletion. As a result, the threshold voltage of the memory cells which are connected to the word line to the row address supplied from address buffer 2 is equal to or lower than the "erase determination level 1", so that memory cell s are turned ON and current having the amount of current depending on the above-mentioned word line voltage to the digit line.

In contrast, since the memory cells are turned OFF if the threshold voltage of the memory cells is higher than the "erase determination level 1", current does not pass through the digit line connected to the selected memory cells. Of course, if the memory cells connected to the same digit line comprises the memory cell having deep depletion, current passes through the digit line for the amount of current which passes through these memory cells. On the other hand, column decoder switch 4 connects the digit line to sense amplifier 5, wherein the digit line is corresponding to the column address supplied by address buffer 2. Sense amplifier 5 send the comparison result of the amount of current passing through this digit line and the amount of current Iref to sequence controller 10.

Sequence controller 10 determines threshold voltage of the selected memory cells reaches the "erase determination level 1" if the amount of current of the digit line is equal to or greater than the amount of current Iref, and thereafter, the verify is performed about new memory cells. In contrast, if the amount of current passing through the digit line is lower than the amount of current Iref, there are memory cells which are not sufficiently erased ("Fail" in step S3). Therefore, the sequence controller 10 repeats the above-mentioned step S2 and S3. Since all memory cells in the erasable block reaches the "erase determination level 1" by this repeat, the apparent threshold voltage distribution of these memory cells is indicated as the distributions D1 and D6 of the graph in the center of FIG. 2.

4. The First Rewrite/Verify

Subsequently, sequence controller 10 performs the first rewrite/verify (step S4 and S5 in FIG. 5). Sequence controller 10 performs the verify (step S4) using the "rewrite determination level 1". If the rewrite is not terminated ("Fail" in step S4), sequence controller 10 repeats step S4 and S5 to terminate the rewrite ("Pass" in step 4). These process will be explained in detail with reference to FIG. 6 as follows.

Figure 6:
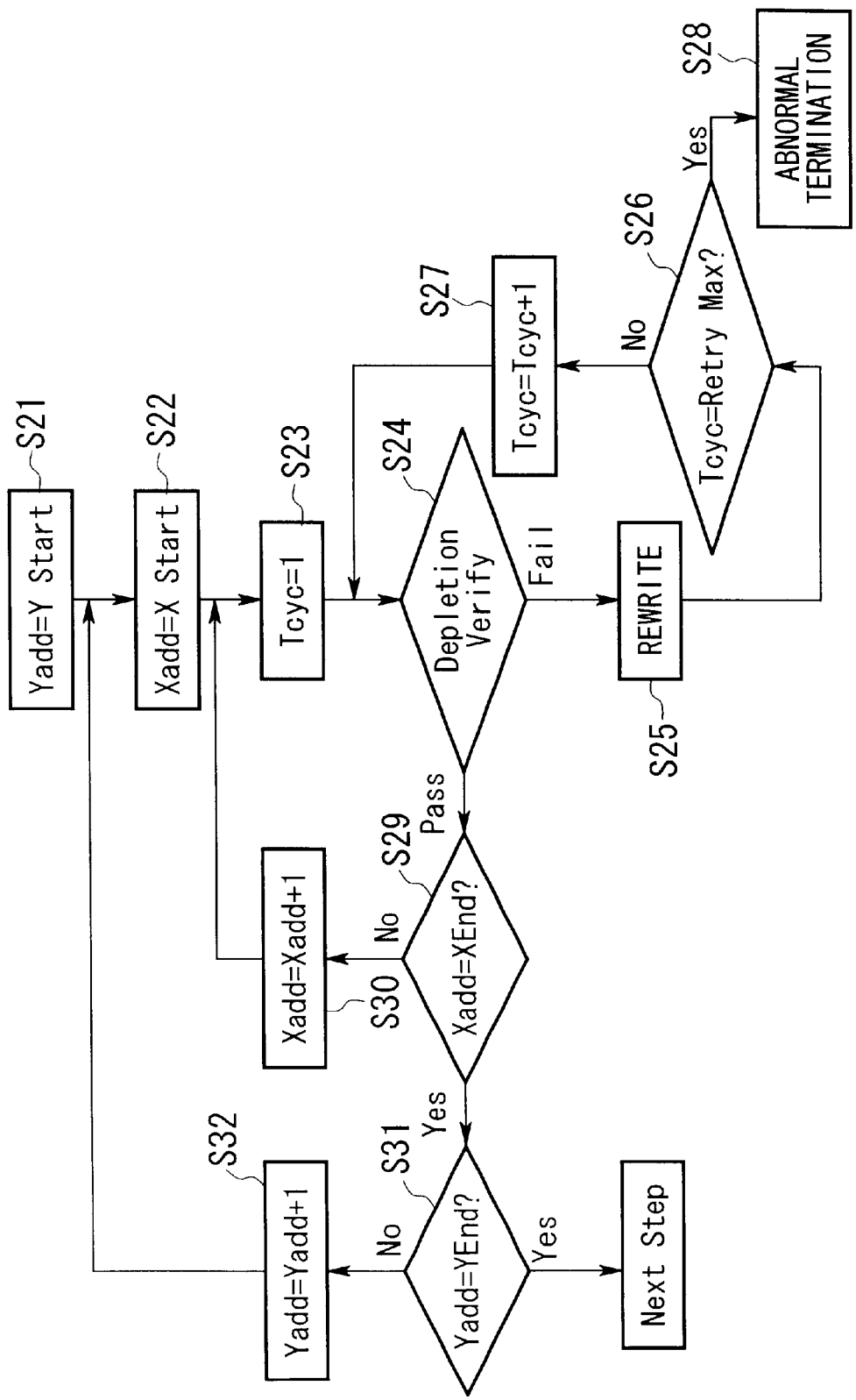
FIG. 6 is a flowchart showing the steps of the rewrite operation in the erase operation of the flash memory according to the first aspect of the present invention.

XStart and XEnd shown in FIG. 6 mean the erase start address at row side and the erase termination address, respectively. YStart and YEnd shown in FIG. 6 mean the erase start address at column side and the erase termination address, respectively. As mentioned above, since data of the digit lines DL2 and DL3 is erased, XStart, XEnd, YStart, and YEnd are determined "1", "3", "2", "3", respectively in sequence controller 10. Furthermore, each Xadd and Yadd shown in FIG. 6 means the row address and the column address of the memory cell for the rewrite/verify at each process. Tcyc means the number of rewrite operating in each rewrite process. Retry Max means the maximum allowable value of the number of rewrite operating. These Sadd, Yadd, Tcyc, and Retry Max are remained in the register in the sequence controller 10.

At first, sequence controller 10 initializes Yadd to YStart (="2") (step S21) and simultaneously, sequence controller 10 initializes Xadd to XStart (="1") (step S22). The address composed of Xadd and Yadd is supplied to address buffer 2 and the memory cells for the rewrite/verify are specified. Next, sequence controller 10 initializes Tcyc to "1" (step S23) and thereafter, the verify is performed (step S24). Sequence controller 10 commands high-voltage generation circuit 11 so as to perform the verify, so that the high-voltage generation circuit 11 generates the word line voltage greater than the voltage generated when normally reading and row decoder driver 3 applies the word line voltage to the word line WL1 which corresponds to the value of XStart "1".

Accordingly, the voltage between the gate and the source of each memory cell connected to the word line WL1 is, for example, the voltage $V_{VER}$ shown in FIG. 3. Simultaneously, since sequence controller 10 commands high-voltage generation circuit 13, high-voltage generation circuit 13 generates the voltage (for example, the voltage $V_{REFb}$ shown in FIG. 3) so as to be the amount of current (for example, the amount of the current Iref shown in FIG. 3) so that the amount of current Iref is equal to the "rewrite determination level 1". Subsequently, the verify operation is performed in a similar process explained in the erase/verify and the sense results with regard to the memory cell 2-12 specified by Xadd and Yadd are sent to sequence controller 10 from sense amplifier 5.

According to the sense results, since the memory cell is in deep depletion state if the threshold voltage of the memory cell is lower than the "rewrite determination level 1" ("Fail" in step S24), sequence controller 10 performs the rewrite to the memory cell 2-12 and threshold voltage of the memory cell 2-12 is increased (step S25). The rewrite itself is the same as the rewrite performed in the conventional flash memory. For example, the control gate, the drain terminal, and the source terminal of the memory cell for rewrite are applied the voltages "12 V", "7 V", and "0 V", respectively and are written for each predetermined time.

After rewriting one cycle, sequence controller 10 observes the number of the rewrite, and then, however, Tcyc is "1", that is, Tcyc does not reach Retry Max ("No" in step S26). For the next verify, sequence controller 10 increases Tcyc for the increment "1" (step S27) and the verify/rewrite is repeated again. Steps S24 to S27 are repeated until the threshold voltage of the memory cell 2-12 being greater than the "rewrite determination level 1" ("Pass" in step S24) and sequence controller 10 performs the rewrite/verify about the next memory cell.

Sequence controller 10 determines whether Xadd (=1) coincides with XEnd (=3), accordingly, sequence controller 10 observes whether there remains the memory cell for which the rewrite/verify is not performed for each digit line indicated YStart (=2). In this case, since both do not coincide ("No" in step S29), sequence controller 10 increases Xadd for the increment "1" (step S30) and performs the rewrite/verify about the next memory cell 2-22 (steps S23 to S30).

If Tcyc reaches Retry Max by repeating steps S24 to S27, Tcyc will not be equal to or higher than the "rewrite determination level 1" by further repeating of the rewrite. Therefore, sequence controller 10 performs an abnormal termination (step S28). Steps S23 to S30 are repeated until the rewrite/verify is terminated about each memory cell connected to the digit line DL2 ("Yes" in step S29). Sequence controller 10 performs the rewrite/verify about new digit line DL3.

To perform the rewrite/verify about new digit line DL3, sequence controller 10 determines whether Yadd (=2) coincides with YEnd (=3), accordingly, sequence controller 10 observes whether there is the digit line for which the rewrite/verify is not performed. In this case, since both do not coincide ("No" in step S31), sequence controller 10 increases Yadd for the increment "1" (step S32) and performs the rewrite/verify about each erasable memory cells connected to the digit line DL3 (steps S22 to S31). Steps S22 to S31 are repeated until the rewrite/verify is terminated about each erasable digit line ("Yes" in step S31). Sequence controller 10 proceeds the second step (see FIG. 5).

5. The Second Erase/Verify

In the erase/verify in the second step (step S6 and S7), except the "erase determination level 2" is used instead of the "erase determination level 1" used in the first step, the erase/verify of the second step is the same as that of the first step. When the second erase/verify is terminated ("Pass" in step S7), the threshold voltage distribution of the erasable block is the distribution D8 in the graph on the right in FIG. 2 and the upper limit of the threshold voltage is equal to or lower than the voltage of the "erase determination level 2" as a desired value.

6. The second Rewrite/Verify

When the second erase/verify is performed, the memory cells having the threshold voltage being lower than the voltage of the "rewrite determination level 2" as shown in the distribution D8 in FIG. 2 may generate. Sequence controller 10 performs the rewrite/verify as well as that of the first step using the "rewrite determination level 2" instead of the "rewrite determination level 1" used in the first step (steps S8 and S9).

The "rewrite determination level 2" is set so as to be ΔV higher than the "rewrite determination level 1". Therefore, if the voltage $V_{VER}$, which is the same voltage used in the first rewrite/verify, is applied to the word line, the amount of current to be flowed to the reference cell 6 is lower than the amount of current Irb shown in FIG. 2. Accordingly, the voltage to be applied to the control gate of the reference cell 6 is lower than the voltage $V_{VERb}$. When the second rewrite/verify is terminated ("Pass" in step S8), the threshold voltage distribution of the memory cell is between the "rewrite determination level 2" and the "erase determination level 2" as desired and the erase operation is terminated about every memory cell in the erasable block.

Furthermore, the above-mentioned preliminary write operation differs from the rewrite operation in the following point. In step S24 of FIG. 6, the "rewrite determination level 1" or the "rewrite determination level 2" is used. However, when the preliminary write operation is performed, the characteristic of reference cell 6 is specified as, for example, characteristic C2 of FIG. 3, in order to distinguish "0" and "1" and the same voltage, for example, 5 V, is applied to selected word line and the reference cell 6. Sequence controller 10 determines data stored in the memory cell is in either the erase cell or the write cell. If data is in the erase cell, the write is performed for each predetermined time and steps S24 to S27 are repeated until the threshold voltage of the write cell.

The Second Embodiment

Figure 7:
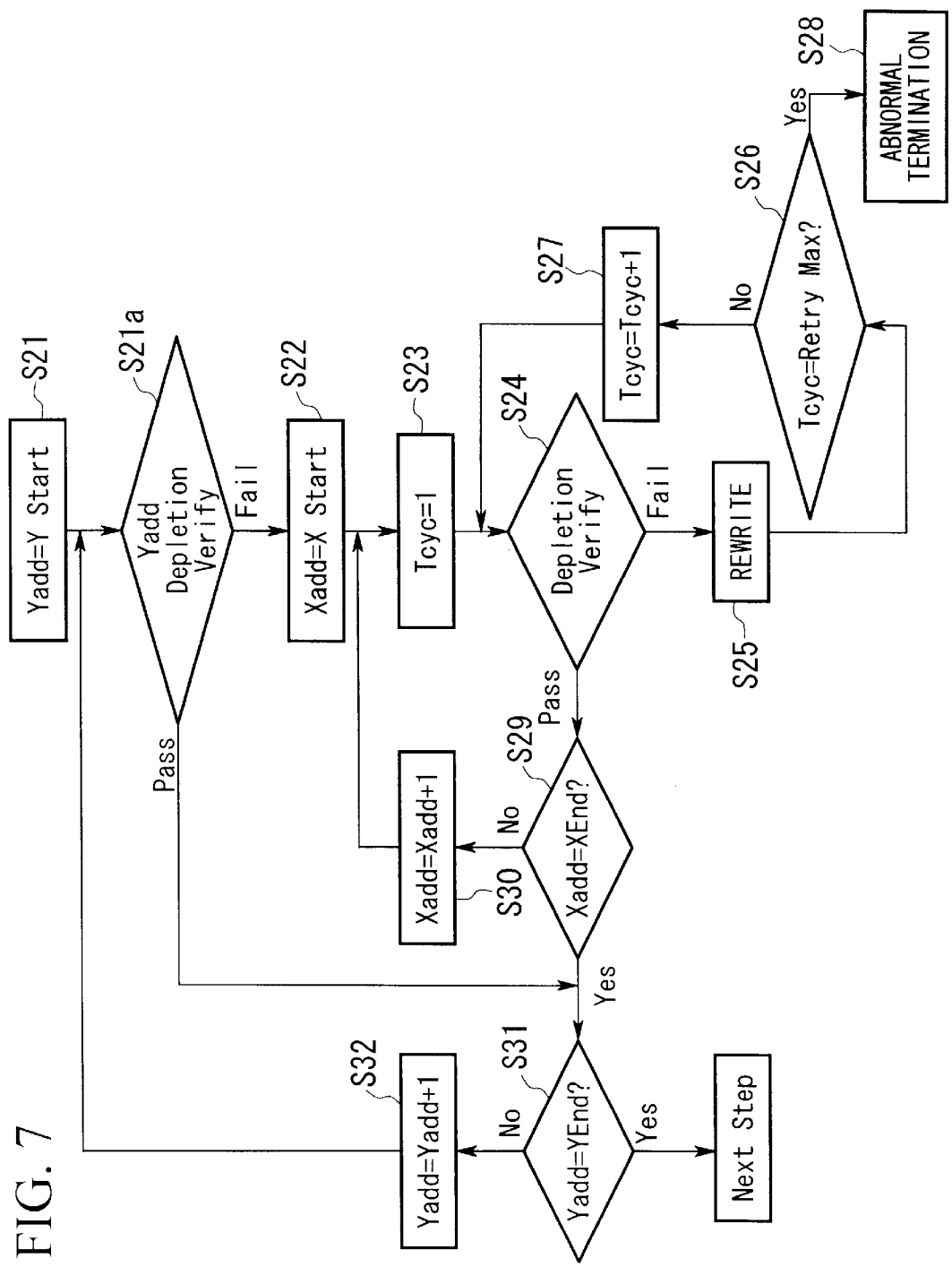
FIG. 7 is a flowchart showing the steps of the rewrite operation in the erase operation of the flash memory according to the second aspect of the present invention.

In the second embodiment, the process performed when there is no memory cell having deep depletion in the memory cells connected to the same digit line is accelerated more than the process in the first embodiment. The structure of the flash memory itself according to this embodiment is the same structure according to the first embodiment (FIG. 1) and the total operation is similar to that of the first embodiment (FIG. 5). However, steps of control by sequence controller 10 differs from the first embodiment. FIG. 7 is a flow chart illustrating steps of rewrite according to the present embodiment and the difference between FIG. 6 and FIG. 7 is shown as follows.

The determination whether or not there is at least one memory cell having deep depletion in the erasable digit line can be obtained by verifying once. In the present embodiment, whether or not there is the memory cell having deep depletion is pre-detected (step S21a) before the rewrite/verify is performed for each memory cell connected to the digit line (steps S22 to S30). In order to verify for this detection, the amount of current Iref which flows to the reference cell 6 is set to approximately "0" and simultaneously, the voltage is not applied the word lines WL1 to WL 3. Furthermore, if current passes through the erasable digit line, it is judged that there is at least one memory cell having deep depletion. If current does not passes through the erasable digit line, it is judged that there is no memory cell having deep depletion.

When there is no memory cell having deep depletion, sequence controller 10 performs the rewrite/verify about new digit line by proceeding the process to the step S31. On the other hand, when there is the memory cell having deep depletion, sequence controller 10 performs the rewrite/verify for each memory cell by proceeding the process to the step S22 as well as the first embodiment. As mentioned above, in the present embodiment, with regard to the digit line containing no memory cell having deep depletion, it is unnecessary that the verify is performed for each erasable memory cell connected to the digit line as the first embodiment. Therefore, total process time required in the erasing process can be shortened.

MODIFIED EXAMPLE (1) In the above-mentioned embodiments, each 2 types of the rewrite determination levels and the erase determination levels are set for each step in different level. However, in the following case, one type of erase determination level is set and the erase determination level 2 may be used together in the erase/verify of the first and second steps. Though the apparent (error) distribution is restored to the actual distribution by the first rewrite/verify, there may be surely no memory cells being in the level which is higher than the "erase determination level 2". In this case, data in the memory cells may be erased up to the "erase determination level 2" which is a desired erase level when the first erase/verify performed. Accordingly, there is no need to perform the erase/verify in the second step and only rewrite/verify is necessary. Therefore, total process time required in the erasing process can be shortened and the sequence controller can simply control the process.

(2) As mentioned above, the rewrite of the memory cell is performed by repeating the write for each predetermined time, so that the number of times for write increases according to increasing the level to be rewritten (that is, the increment of threshold voltage). Accordingly, the current consumption required for the rewrite increases. On the other hand, since the amount of write for each predetermined time increases according to the voltage of word line increases, therefore, the number of times for write cane be decreased and the current consumption can be reduced.

In the above-mentioned each embodiment, it is presumed that the word line voltage when the memory cell is written is the same in both the first rewrite/verify and the second rewrite/verify. However, as shown in FIG. 2, in the point of the level to be rewritten, the first rewrite/verify is higher than the second rewrite/verify, so that the amount of current is consumed more for that. Then, the word line voltage in the first rewrite/verify may be set to be higher than the word line voltage in the second rewrite/verify so as to be reduced the current consumption in the first rewrite.

(3) In the above-mentioned each embodiment, the NOR type flash memory is presumed and explained. However, the present invention can be applied to various type non-volatile semiconductor memory device as long as the non-volatile semiconductor memory device in which there is the memory cell having deep depletion so as to give rise to problems. That is, the present invention can be effectively used for the non-volatile semiconductor memory device in which a plural memory cells are connected to the same digit line and the threshold voltage distribution is affected by the amount of current passing through the memory cells having deep depletion, so that the determination of the threshold voltage (the verify of the memory cells) is hindered. Therefore, other than general NOR-type flash memory as mentioned above, the present invention can be applied to a virtual ground type flash memory, an NOR-type flash memory in which the digit line is divided, or the like.

In the virtual ground type flash memory, the control gates of a plural memory cells are connected to the same word line and the bit line is formed by connecting the source terminal of adjacent memory cells and the drain terminal. Furthermore, in the NOR-type flash memory in which the digit line is divided, the digit line has a hierarchical structure and also the rewrite is performed using tunnel effect, so that there are advantages of both the NOR-type and the NAND-type flash memories. Additionally, with regard to a flash memory adopting split gate storing type memory cells in which each memory cell comprises the function of selector transistor and the NAND-type flash memory in which the memory cells is connected to the digit line in series, the problem of depletion is not arisen, so that the present invention is not applied to these flash memories.

What is claimed is:

1. A non-volatile semiconductor memory device comprising a non-volatile memory cell which is capable of being written to and totally erased electrically and in which a threshold voltage distribution of the memory cell is affected by memory cells in which data is over-erased, wherein the memory is provided with:

a first erasing means for totally erasing erasable memory cells, a first rewriting means for rewriting memory cells in which data is over-erased by totally erasing while simultaneously verifying each memory cell, a second erasing means for erasing memory cells which are not erased up to a desired erase determination level after the first rewrite, and a second rewriting means for rewriting memory cells which are not rewritten up to a desired rewrite determination level while simultaneously verifying each memory cell after the second erase.

2. A non-volatile semiconductor memory device comprising a non-volatile memory cell which is capable of being written to and totally erased electrically and in which a threshold voltage distribution of the memory cell is affected by the memory cell in which data is over-erased, wherein the memory is provided with:

a first erasing means for totally erasing erasable memory cells up to a first erase determination level which is higher than a desired erase determination level, a first rewriting means for rewriting memory cells in which data is over-erased by totally erasing up to a first rewrite determination level lower than a desired rewrite determination level while simultaneously verifying each memory cell, a second erasing means for erasing memory cells which are not erased up to the desired erase determination level after the first rewrite, and a second rewriting means for rewriting memory cells which are not rewritten up to the desired rewrite determination level while simultaneously verifying each memory cell after the second erase.

3. A non-volatile semiconductor memory device according to claim 2, wherein the first erase determination level is set higher than the desired erase determination level for an amount of increased voltage when the threshold voltage of the memory cells in which data is not over-erased increases during rewriting by the first rewriting means.

4. A non-volatile semiconductor memory comprising a non-volatile memory cell which is capable of being written to and totally erased electrically and in which a threshold voltage distribution of the memory cell is affected by memory cells in which data is over-erased, wherein the memory is provided with:

an erasing means for totally erasing erasable memory cells up to a desired erase determination level, a first rewriting means for rewriting memory cells in which data is over-erased by totally erasing up to a first rewrite determination level lower than a desired rewrite determination level while simultaneously verifying each memory cell, and a second rewriting means for rewriting memory cells not rewritten up to the desired rewrite determination level while verifying each memory cell after the first rewrite.

5. A non-volatile semiconductor memory according to claim 2, or 4, wherein the first rewrite determination level is set lower than the desired rewrite determination level for an amount of increased voltage when the threshold voltage of the memory cells in which data is not over-erased increases during rewriting by the first rewriting means.

6. A non-volatile semiconductor memory according to any one of claims 1, 2 or 4, wherein a rewrite control voltage to be applied to the memory cells when the first rewrite determination means performs a rewrite is higher than a rewrite control voltage to be applied to the memory cells when the second rewrite determination means performs a rewrite.

7. A non-volatile semiconductor memory according to any one of claims 1, 2, or 4, wherein a read control voltage for verifying to be applied to the memory cells when verifying while rewriting is higher than a read control voltage to be applied during normal reading by the first rewriting means or the second rewriting means.

8. A non-volatile semiconductor memory according to any one of claims 1, 2, or 4, wherein the first rewriting means or the second rewriting means detects, for each digit line, whether there are memory cells in which data is over-erased in the digit line for rewriting, and verifies and rewrites the digit line for each memory cell only when there are memory cells in which data is over-erased.

9. A non-volatile semiconductor memory according to any one of claims, 1, 2, or 4, wherein the first rewriting means or the second rewriting means rewrites the memory cells which are to be rewritten to the mean of the threshold voltage distribution of the memory cells in which data is not over-erased.

10. A non-volatile semiconductor memory comprising a non-volatile memory cell which is capable of being written to and totally erased electrically and in which a threshold voltage distribution of the memory cell is affected by memory cells in which data is over-erased, wherein only the memory cells in which data is over-erased are detected in memory cells for erasure and rewritten to a first desired threshold voltage, and then further rewritten to a second desired threshold voltage in accordance with a desired threshold voltage distribution.

11. A non-volatile semiconductor memory comprising a non-volatile memory cell which is capable of being written to and totally erased electrically and in which a threshold voltage distribution of the memory cell is affected by memory cells in which data is over-erased, wherein a threshold voltage distribution of memory cells for erasure, which appears to be at a lower position owing to the memory cells in which data is over-erased, is restored to an actual threshold voltage distribution by rewriting said memory cells in which data is overerased to a first desired threshold voltage and then rewriting said memory cells in which data is overerased to a second desired threshold voltage in accordance with a desired threshold voltage distribution.

* * * * *